United States Patent [19]

Misawa et al.

[11] 4,370,804

[45] Feb. 1, 1983

[54] ELECTRONIC COMPONENT INSERTING APPARATUS

[75] Inventors: Yoshihiko Misawa, Katano; Akira Kabeshita, Moriguchi; Kazuhiro Mori; Hiroshi Nakagawa, both of Katano, all of Japan; Shigeru Araki, deceased, late of Katano, Japan, by Kaeko Araki, administratrix

[73] Assignee: Matsushita Electric Industrial Co., Ltd., Kadoma, Japan

[21] Appl. No.: 183,839

[22] Filed: Sep. 3, 1980

[30] Foreign Application Priority Data

Sep. 6, 1979 [JP] Japan ................................ 54-114500

[51] Int. Cl.³ ............................................ B23P 23/00
[52] U.S. Cl. .................................................. 29/741
[58] Field of Search ....................... 29/741; 74/20, 23; 227/110

[56] References Cited

U.S. PATENT DOCUMENTS

| 956,462 | 4/1910 | Windsor | 74/23 |
|---|---|---|---|
| 2,228,915 | 1/1941 | Rosenmund | 227/110 |
| 3,539,121 | 11/1970 | Peters | 74/20 |
| 4,177,549 | 12/1979 | Mori et al. | 29/741 |

Primary Examiner—Lowell A. Larson
Attorney, Agent, or Firm—Wenderoth, Lind & Ponack

[57] ABSTRACT

An apparatus for automatically mounting electronic components on printed circuit boards has an insertion head which is adapted to rotate on an engaging shaft within a rotary bearing and be guided in the extent of rotation by means of a steel ball. Only the engaging shaft rotates and the position from which the components are supplied to the insertion head is stationary, the space needed for the inserting apparatus can be kept small. The bearing can be changed or the position of the bearing changed to change the insertion angle of the component relative to the printed circuit board, thus making possible various arrangements of the components on the circuit board.

4 Claims, 13 Drawing Figures

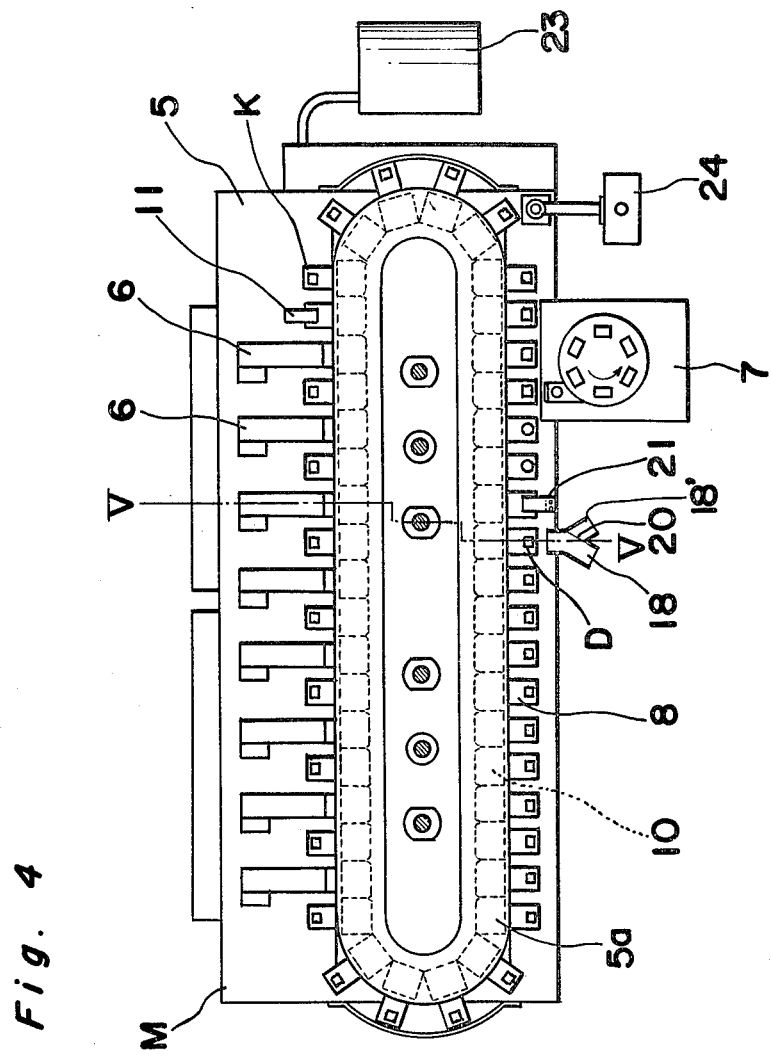

Fig. 11
Fig. 12
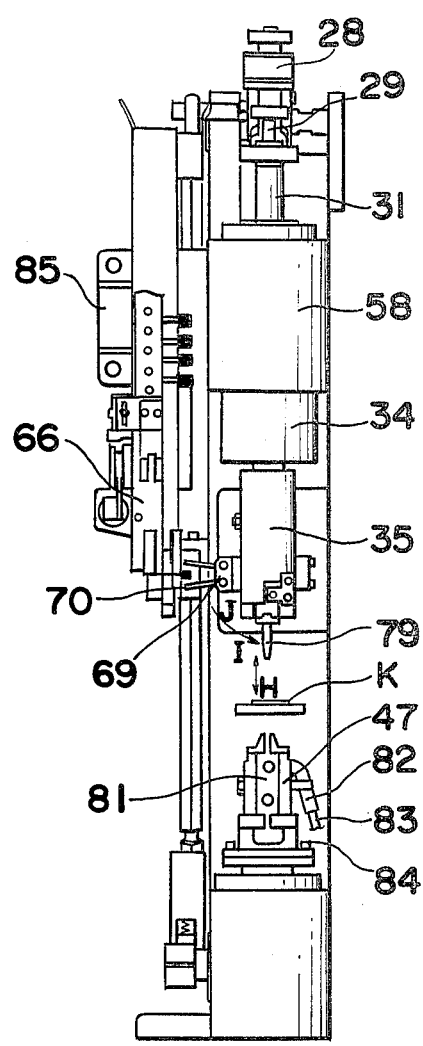
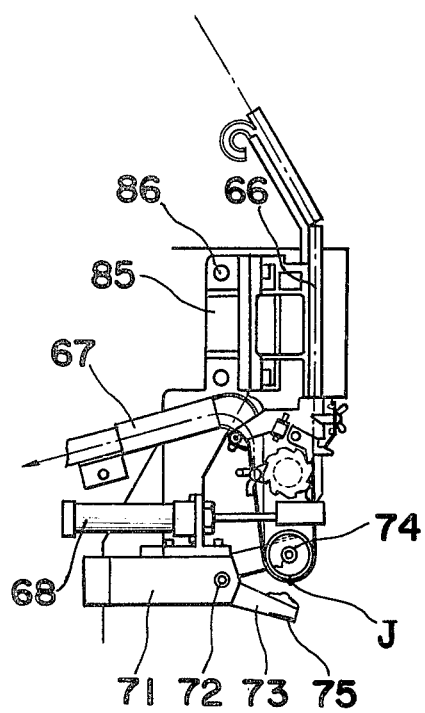

ELECTRONIC COMPONENT INSERTING APPARATUS

BACKGROUND OF THE INVENTION

The present invention relates to an electronic component inserting apparatus for automatically inserting the electronic components into a printed circuit board and, more particularly, to an inserting apparatus for use in a component mounting machine suitable for small-sized printed circuit boards, which is adapted to easily rearrange the positions of the components on the circuit board by changing the insertion angle of the components to be inserted into the circuit boards in accordance with the required arrangement of the components on the circuit board.

Conventionally, such components C are engaged, in the same direction, with respect to an axis of the circuit board K as shown in FIG. 1 while the circuit board is transferred among many inserting apparatuses so as to mount the various components thereon. However, the design of circuits on such a circuit board is difficult and a dense arrangement of components can not be achieved. To avoid this difficulty, several different component insertion angles relative to the board axis must be used by the inserting apparatus to mount the components on the circuit board to form a dense arrangement of the components. There is shown in FIG. 2, a method of inclining the inserting apparatus bodies S with respect to the length of the transfer apparatus T carrying the circuit boards K. FIG. 3 shows an inserting apparatus according to the prior art and having an actuator 2 and gears 3 and 4 used to turn the insertion head 1 of the inserting apparatus S to the various inserting angles for the component thereby to change the inserting angle of the component without changing the mutual relationship between the inserting apparatus S and the circuit board. However, an inserting apparatus which is capable of inclining the apparatus body for achieving the desired insertion angle, as shown in FIG. 2, has disadvantages in that the angle to which the apparatus body can be inclined in limited and the pitch between the inserting apparatuses must be large. The apparatus of FIG. 3 is disadvantageous in that an actuator 2 and gears 3 and 4 are required for each inserting apparatus S, thus resulting in large-size and expensive apparatus.

SUMMARY OF THE INVENTION

A principal object of the present invention is to provide an electronic component inserting apparatus, for automatically inserting electronic components into a printed circuit board in a desired arrangement of the components on the surface of the circuit board which avoids the drawbacks of the apparatus as described hereinabove.

Another object of the present invention is to provide an electronic component inserting apparatus in which it is easy to rearrange the positions in which the components are mounted on the circuit board by changing the insertion angle of the component to be mounted on the circuit board.

A further object of the present invention is to provide an electronic component inserting apparatus which has a compact construction, is easy to operate, functions accurately and has a simple design.

According to the present invention, there is provided an electronic component inserting apparatus for use in a component mounting, comprising a circuit board transfer means for transferring circuit boards and positioning them in component mounting positions, an insertion head disposed above the path along which the circuit boards are transferred and for mounting the components on the circuit boards, an engaging shaft for supporting said insertion head and which is vertically slidable with respect to a circuit board on said transfer path, an engaging shaft driving mechanism for rotatably supporting said engaging shaft and axially reciprocally driving said engaging shaft, and a bearing unit surrounding said engaging shaft rotatably and movably supporting the engaging shaft for rotary movement and movement in the axial direction, and a ball positioned between said engaging shaft and said bearing unit, approximately the half the ball being engaged in a groove provided in the engaging shaft, the other half being engaged in a groove provided in the bearing unit and said bearing unit with the groove therein is adapted to be more detachable than the inserting apparatus body is.

The insertion head, which is adapted to rotate with the engaging shaft which is rotated by the rotary bearing unit connected thereto by the steel ball, can carry out smooth optional rotation so as to change the insertion angle of the component. Since only the engaging shaft rotates and the supply position for the components to be mounted by the insertion head is stationary, the space needed for the operation of the inserting apparatus be kept small. The position of the bearing unit is changed to change the insertion angle of the component relative to the direction of movement of the printed circuit board, thus making possible a wide variety of arrangements of the components on the circuit board.

These and other objects, features and advantages of the present invention will become more apparent from the following detailed description of the present invention when taken in conjunction with the accompanying drawings.

BRIEF DESCRIPTION OF THE DRAWINGS

FIG. 4 is a plan view showing the arrangement of an electronic component inserting machine in accordance with the present invention;

FIG. 11 is a front view of the radial lead component inserting apparatus of FIG. 10;

FIG. 12 is a partial elevation view showing a taping component supply unit employed in the radial lead component inserting apparatus of FIG. 10 and taken from the opposite side of the apparatus from the view of FIG. 10.

DETAILED DESCRIPTION OF THE INVENTION

Figure 8:
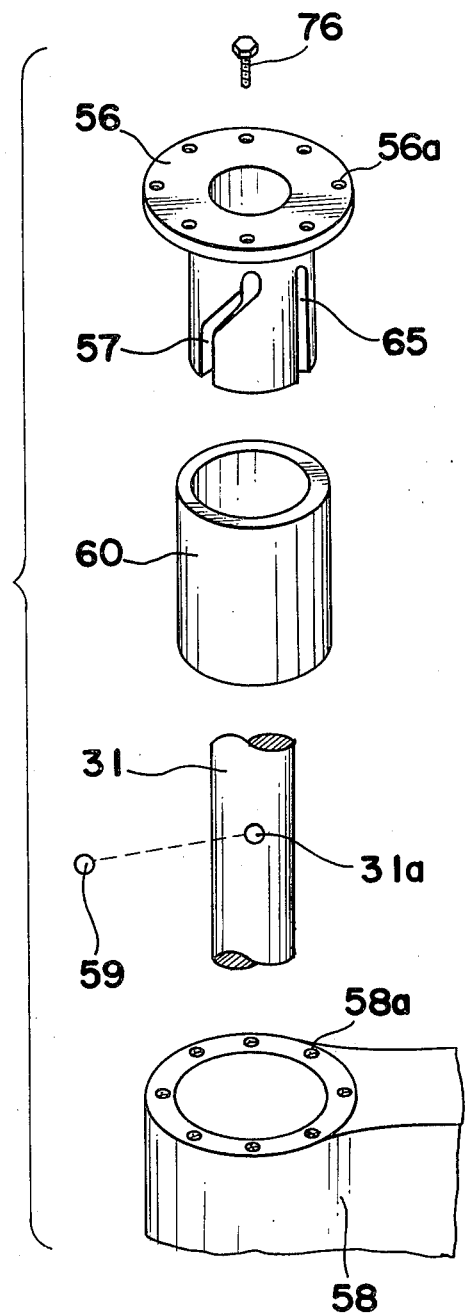
FIG. 8 is an enlarged exploded perspective view showing the relationship of an insertion shaft, a bearing unit and a steel ball forming part of the inserting apparatus of FIG. 7.
Figure 7:
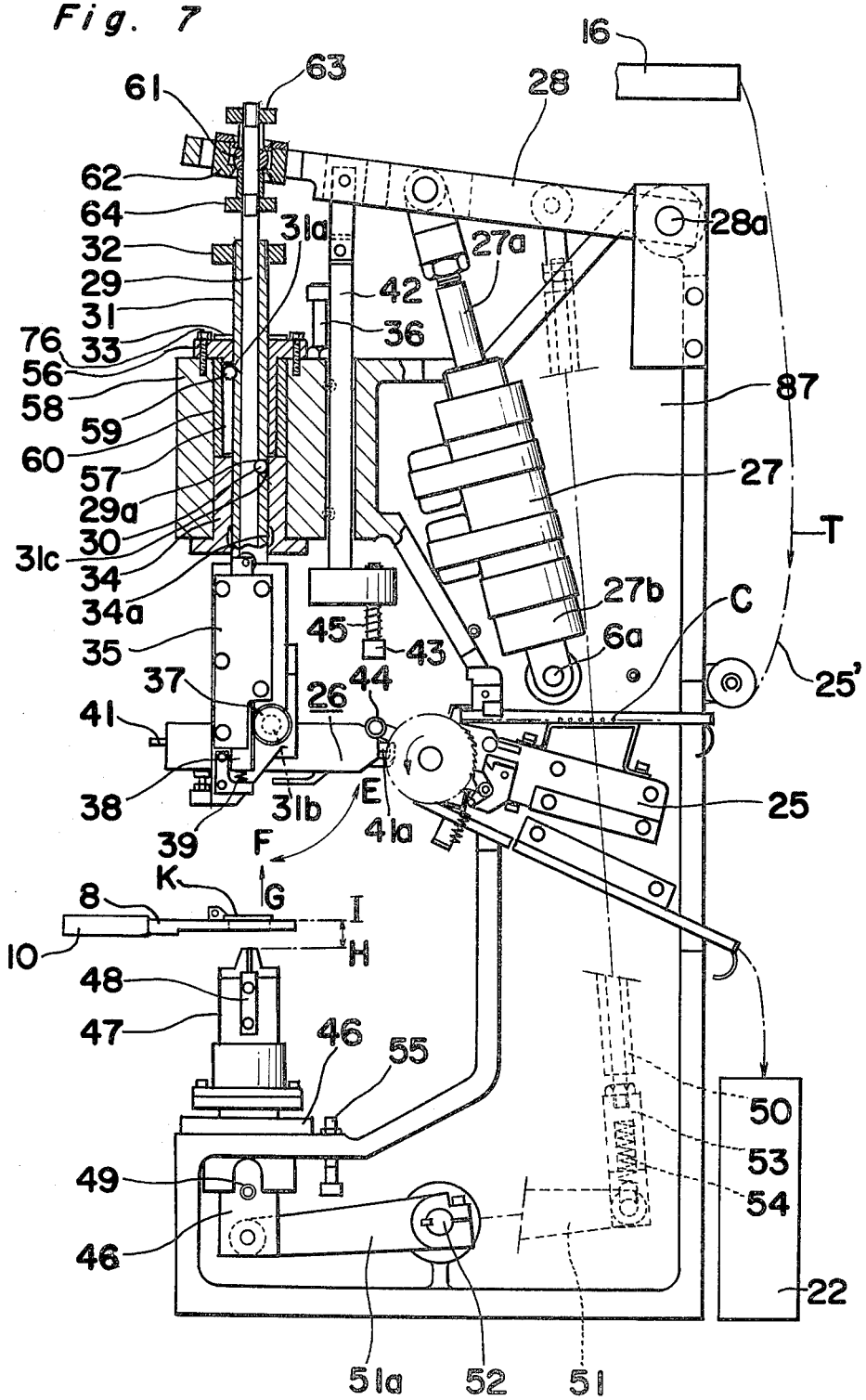
FIG. 7 is an enlarged vertical cross-sectional view of an axial lead type component inserting apparatus according to one embodiment of the present invention, and which can be employed in the electronic component inserting machine of FIG. 4.
Figure 10:
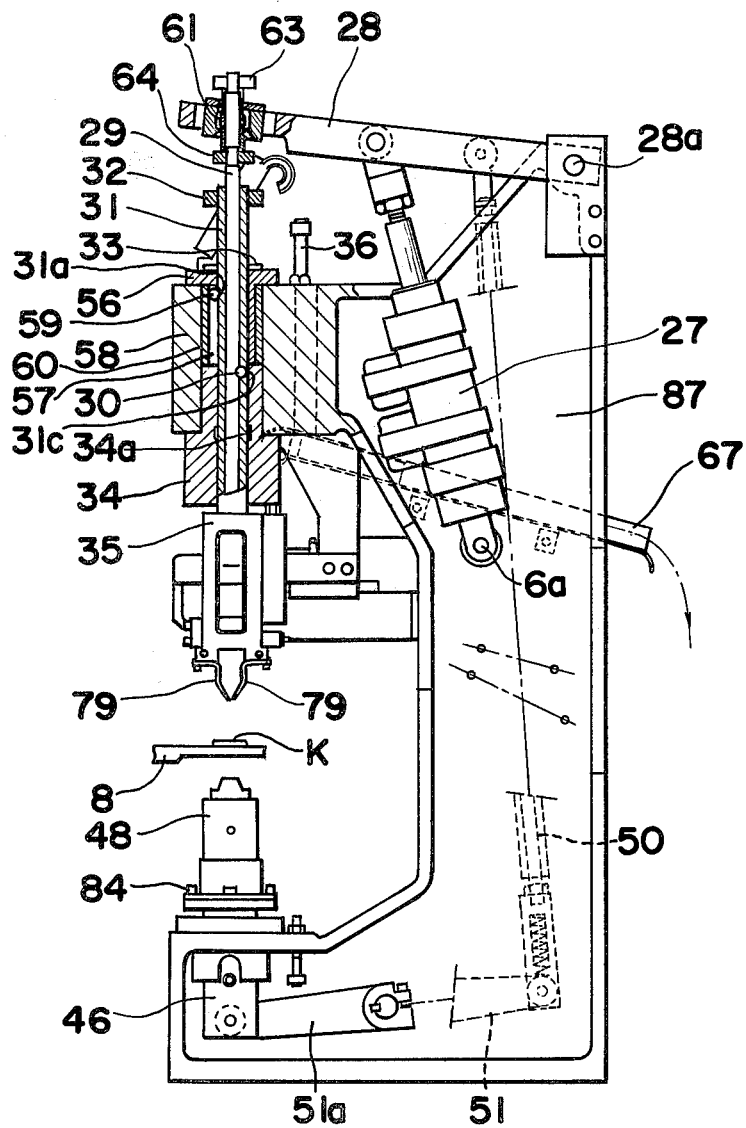
FIG. 10 is an enlarged vertical cross-sectional view of a radial lead type component inserting apparatus for inserting radial lead components, according to another embodiment of the present invention and which can be employed in the electronic component inserting machine of FIG. 4.

Before the description of the present invention proceeds, it is to be here noted that like parts are designated by like reference numerals throughout the several views of the accompanying drawings. Also, it is to be noted that the arrangement of the electronic component inserting machine M as shown in FIGS. 4 and 5 is well known by those skilled in the art, and can include a component inserting apparatus of the present invention for inserting either an axial lead type component C1 as shown in FIGS. 7 and 8 or for inserting a radial lead type component C2 as shown in FIGS. 10 to 12.

Referring first to FIG. 4, the electronic component engaging machine M includes a base 5 provided with an apparatus 5a for transferring a plurality of printed circuit board transfer jigs 8 in succession along an endless belt driven from the center of the base 5 and having around the transferring apparatus 5a in order in the transferring direction of the jigs 8, an apparatus 7 for supplying printed circuit boards K onto the jig 8, a unit 11 for detecting whether a printed circuit board K is present on a jig 8, a plurality of component inserting apparatuses 6 each for inserting an electronic component C into corresponding holes provided in the printed circuit board K in a special direction relative to the direction of transfer and depending on the arrangement of the circuits on the printed circuit board K, a selection chute 18 for discharging the printed circuit boards K with the electronic components C from the jigs 8, and a unit 21 for detecting whether the jigs 8 are empty before supplying printed circuit boards K from the supplying apparatus 7 to the jig 8. Each printed circuit board K is transferred by a jig 8 from the supplying apparatus 7 to the selection chute 18 and along the transfer path passes each of the inserting apparatuses 6 which insert a component C into the printed circuit board K. The transferring apparatus 5a transfers jigs 8 intermittently at regular intervals along the closed endless path. Each of the inserting apparatuses 6 is independently provided in parallel with the other apparatuses and a certain pitch corresponding to the distance of the jigs 8 are transferred, so that the jigs 8 successively stop in front of each transferring apparatus. The supplying apparatus 7 is provided for supplying printed circuit boards K to jigs 8 one by one in a known manner, and the printed circuit boards K are positioned and retained on printed circuit board transfer jigs 8 at the positions corresponding to the positions of the jigs. A plurality of side-by-side pallets 10 are provided on the endless belt and are intermittently moved at a constant pitch by barrel cams (not shown) of the transferring apparatus 5 and the printed circuit board transfer jigs 8 are secured to the pallets 10.

The feed detecting unit 11 is adapted to detect whether or not a printed circuit board K is present in the printed circuit board transfer jig 8, and when a printed circuit board K is present, an operating instruction is given to a subsequent inserting apparatus 6.

Figure 1:
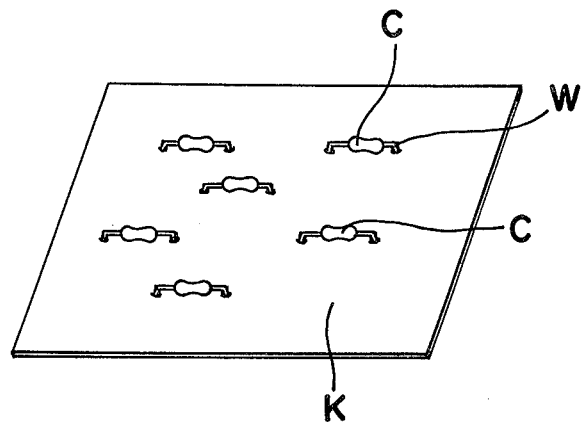
FIG. 1 is a perspective view of a printed circuit board showing electronic components mounted thereon in positions aligned with the direction of movement of the board past an inserting apparatus.
Figure 2:
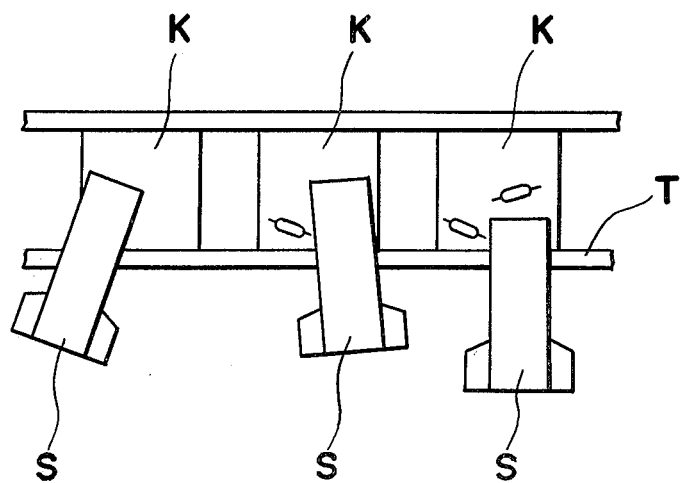
FIG. 2 is a plan view of a conventional way of arranging the insertion heads for inserting components at different insertion angles.
Figure 3:
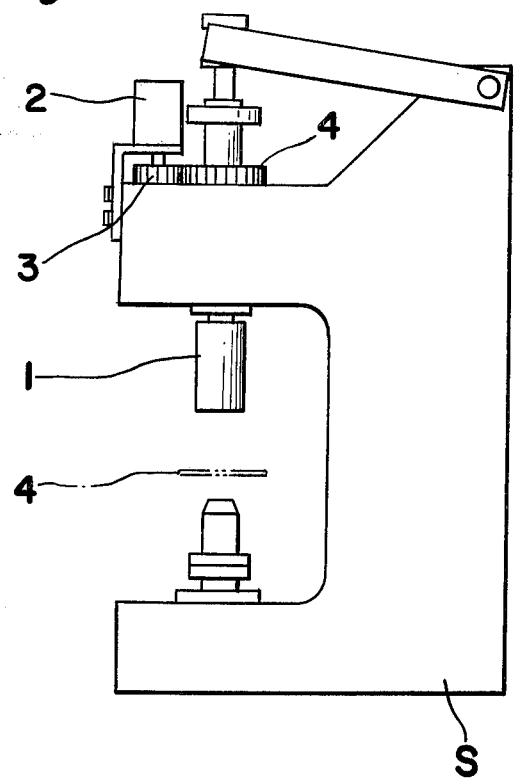
FIG. 3 is a side elevational view showing a conventional electronic component inserting apparatus wherein the insertion angle for the components can be changed by a motor driven means.
Figure 5:
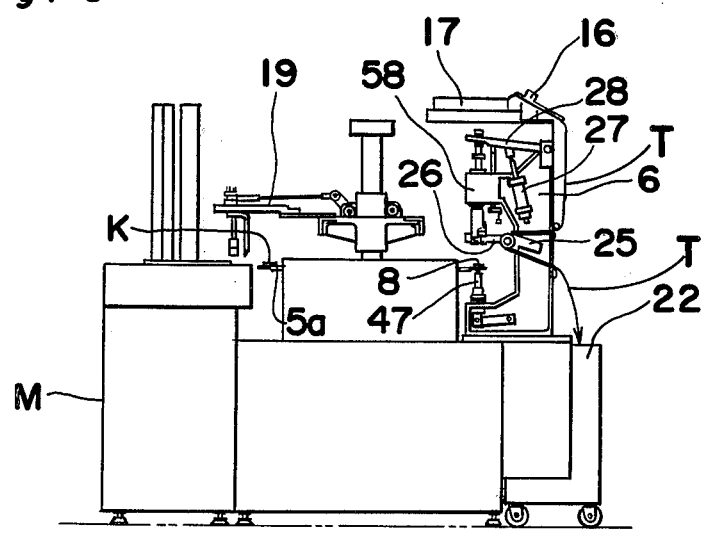
FIG. 5 is a cross-sectional view of the electronic component inserting machine of FIG. 4 taken along a line V—V of FIG. 4.

In the inserting apparatus 6 as shown in FIG. 5, a tape guide 16 is provided for guiding a component carrying tape T from a tape pack 17 provided on the top of apparatus 6 to a component cassette 25 provided at the center of the apparatus, and the scraps of the tape T are discharged from the cassette 25 to a box 22 provided at the bottom, the tape carrying components C including electronic component bodies and lead wires W arranged in parallel along a tape T in the lengthwise direction of the tape and wound as a coil accommodated in the pack 17 and drawn out from the pack 17 toward the component cassette 25 in a well known in the conventional manner.

The selection chute 18, which is provided to discharge the printed circuit boards K, is adapted to direct circuit boards K from jigs 8 of the transferring apparatus 5a at the completed circuit board withdrawing position D by the operation of a tool plate 19 for withdrawing the printed circuit board K from a jig 8 and which is actuated in a known manner similar to the operation of a tool plate of the apparatus 7 for supplying the printed circuit boards K.

An assorting plate 20 is provided within the selection chute 18 which is operable to prevent defective circuit boards from flowing through the selection chute 18 by diverting them into a side chute 18'.

The printed circuit board detection unit 21 detects whether or not the circuit board K has been discharged, from the printed circuit board transfer jig 8, at a completed circuit board withdrawing position D. A main control box 23 is provided for the electronic component inserting machine M which sequentially controls all the apparatuses. An operation operating panel 24 having a plurality of operating buttons is associated with the main control box 23.

Figure 6:
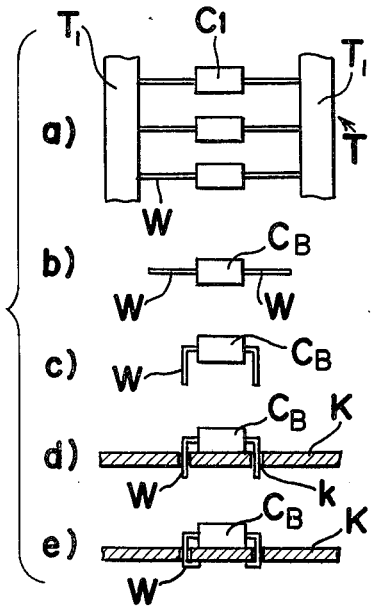
FIGS. 6(a) to (e) are diagrammatic views showing the steps for inserting an axial lead type component into a board.
Figure 9:
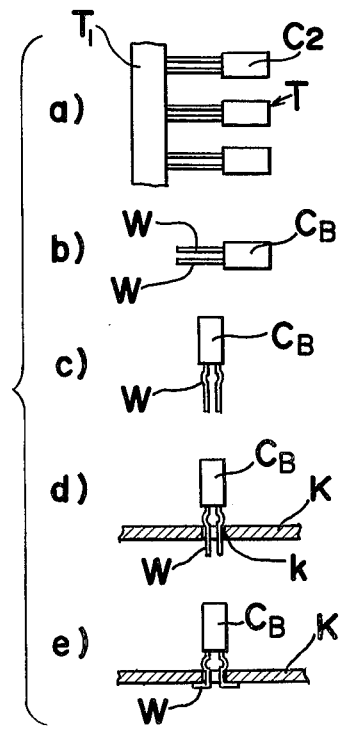
FIGS. 9(a) to (e) are diagrammatic views showing the steps for inserting a radial lead type component into a board.

The inserting apparatuses 6 are normally of two different types, an axial lead type component inserting apparatus for inserting into the circuit board K a component C1 having a pair of axial lead wires W as shown in FIG. 6 and a radial lead type component inserting apparatus for inserting into the circuit board a component C2 having a pair of radially extending lead wires W projecting from one edge of the body $C_B$ of the component as shown in FIG. 9.

Referring now to FIG. 6, the axial lead type component C comprises a component body $C_B$ and a pair of lead wires W each extending in opposite directions from the component body $C_B$ in a line in the axial direction of the component body $C_B$ and may be positioned in a known manner between a pair of tape members T, so as to form the tape T as shown in FIG. 6(a).

The axial lead type component inserting apparatus 6 shown in FIGS. 7 and 8 is operated in sequence to guide the tape T from the pack 17 to the component cassette 25 by means of the tape guide 16, to separate the individual components C from the tape T by cutting the pair of lead wires W as shown in FIG. 6(b), to form the lead wires W into a special shape by means bending as shown in FIG. 6(c), to rotate the component C1 and placing it in the required direction relative to the direction of movement of the circuit board K by means of a cam groove 57 provided on a bearing unit 56 as described hereinafter, to insert the lead wires W into corresponding holes k provided in the circuit board K as shown in FIG. 6(d), and, then, to bend the ends of the lead wires W to attach the component onto the circuit board K as shown in FIG. 6(e). Therefore, the inserting apparatus 6 includes a means for guiding the component C from the component cassette 25 to the circuit board K, a means for rotating the component C to place it in the required position relative to the direction of movement of the circuit board K, and a means for forming the lead wires W to insert and attach them to the circuit board K. In the axial lead component inserting apparatus 6, the tape T is intermittently fed a constant pitch intervals along the path shown in the one-dot chain line 25' of FIG. 6 from the pack 17 shown in FIG. 5 to the component cassette 25 in a known manner. An insertion head 26 is rotatable together with a pinion 37 therein and is shiftable axially of an inserter shaft 29. The axial leadcomponents C fed through the component cassette 25 are separated from the tape T by cutting off the ends of the lead wires to a given length by the operation of the insertion head 26 at a component withdrawing position E as shown in FIG. 7 and simultaneously the lead wires W are formed into the shape of a U in a known manner, with the component C after the forming operation being retained on the tip end of the insertion head 26.

An insertion cylinder 27 has a case 27b pivotally mounted on the body 58 of the inserting apparatus 6 on pin 6a and the piston rod 27a thereof is pivotally connected to the lever 28 to rotate the lever 28 around a pin 28a provided on the frame 6a when the piston rod 27a moves, whereby the shaft 29 of the inserter, connected with the free end of the lever 28 through a spherical bearing 56, is moved up and down together with the insertion head 26.

A pair of bushings including an upper bushing composed of a collar 60 and a bearing 56 and a lower bushing 34 are fixedly provided on the front of the body 58 of the inserting apparatus 6 and have a hollow cylindrical shaft 31 slidably mounted therein with the inserter shaft 29 being slidably positioned with the shaft 31, the cylindrical shaft 31 being connected with the shaft 31b of the pinion 37 and the inserter shaft 29 is being connected with pusher 41 on the portion of the inserting head 26 opposite the end holding the component. The lower bushing 34 and the collar 60 of the upper bushing are fixedly mounted in a bore provided in the body 58 and the bearing 56 is removably mounted within the collar 60 and held to the body 58 by means of bolts 76. The bearing 56 has a flange having a plurality of holes 56a for receiving the bolts 76 and at least one groove 57 in the cylindrical portion in which a steel ball 59 held in a recess 31a in a cylindrical shaft 31 is guided in the peripheral direction and/or axial direction of the bearing 56. The shape of each of the grooves 57 and 65 is different from the others as to the distance in the peripheral direction and are almost the same as the other as to the distance in the axial direction, and the position of each of the grooves 57 relative to the cylindrical shaft 31 can be changed by changing the position of the bearing 56 in the nose of the body 58.

The lower bushing 34 has a circular recess 34a at the lower portion of the inner peripheral surface thereof in which can receive a steel ball 30. The cylindrical shaft 31 extends slidably through the pair of bushings and moves axially under the guidance of the steel ball 59 moving in one of grooves 57 in the bearing 56, and the inserter shaft 29 extends slidably through the cylindrical shaft 31. A steel ball 30 is carried in a spherical recess 29a in the inserter shaft 29 and a hole 31c in the cylindrical shaft 31 to lock the shaft 29 to the cylindrical shaft 31 until the hole 31c comes opposite recess 34a. At this point the ball 30 can move into recess 34a of the lower bushing 34 through the hole 31c in the cylindrical shaft 31 to free shaft 29 for sliding relative to cylindrical shaft 31. At the lower end of the cylindrical shaft 31 is a rack housing 35 having a shaft 31b thereon on which is rotatably mounted the pinion 37 which is fixed on the insertion head 26 and which is meshed with a rack 38 slidably accommodated within the rack housing 35. The rack 38 is urged against the lower end of the lower bushing 34 by a compression spring 39 which is provided between the lower end of the rack 38 and the rack housing 35. Accordingly, the insertion head 26 is rotatable not only around the shaft 31b of the pinion 37 between the horizontal position and a vertical position by the rotation of the pinion 37 during movement of the rack 38, but also horizontally together with the rack housing 35 by the rotation of the cylindrical shaft 31 due to the steel ball being guided in a groove 57 in the bearing 56 as the shaft 31 moves within the bushings to change the horizontal position of the insertion head 26 in the peripheral direction of the groove 57 in bearing 56. The lower end of the inserter shaft 29 is slidable in the rack housing 35 and contacts the pusher 41 slidably mounted within the insertion head 26 in an insertion guide 41a only when the insertion head 26 has been rotated to the vertical position by the rotation of the pinion 37. The insertion guide 41a is slidable in the tip end of the insertion head 26 so as to interlock with the pusher 41 for gripping the lead wires W of a component C.

When the inserter shaft 29 is kept in the raised position by the lever 28 as shown in FIG. 7, the steel ball 30 is in the recess 29a of the inserter shaft 29 and the hole 31c of an cylindrical shaft 31 and locks the shafts together so that when the inserter shaft 29 descends by the rotation of the lever 28 actuated by the insertion cylinder 27, the cylindrical shaft 31 descends together with the inserter shaft 29 until a stop ring 32 provided at the top end of the cylindrical shaft 31 comes into contact with a buffer rubber ring 33 provided at the top end of the bearing 56. During this movement ball 31a is guided in a groove 57 to rotate shaft 29 and cylindrical shaft 31 by an amount corresponding to the distance the groove 57 extends in the peripheral direction. When the stop ring 32 comes into contact with the buffer rubber ring 33, the steel ball 30 moves out of the recess 29a in the inserter shaft 29 into the recess 34a in the lower bushing 34 through the hole 31c in the cylindrical shaft 31 so that the cylindrical shaft 31 is fixed with respect to the lower bushing 34 and the shaft 29 is freed from the shaft 31.

After the cylindrical shaft 31 has been fixed with respect to the lower bushing 34, the inserter shaft 29 is caused to descend further by the rotation of the lever 28 until the lever 28 comes into contact with a stop bolt 36 provided on the top of the body 58.

During the descent of the hollow cylindrical shaft 16 carrying the rack housing 35, the rack 38, which is engaged with the pinion 37, is pressed against the lower bushing 34 with the spring 39. Accordingly, the pinion 37 rotates as the cylindrical shaft 31 descends along the rack 38 so as to rotate the insertion head 26 through 90° to the vertical position from the horizontal component receiving position E in FIG. 7 to the vertical position F for rotation completion of the insertion head 26. During this time, the insertion head 26 descends vertically to the insertion position G where the insertion guide 41a on the tip end of the insertion head 26 comes into contact with the circuit board K, which is disposed on a printed circuit board transferring jig 8.

The adjustment of the insertion position G can be achieved by changing the position of the stop ring 32 which is threaded on the upper end of cylindrical shaft 31. After the insertion head 26 descends to the insertion position G, the inserter shaft 29, after being freed from shaft 31, continues to descend to the lowest position I. The pusher 41 projecting from the upper portion of the insertion head 26 is depressed by the lower end of the inserter shaft 29 as to insert into the insertion holes k of the printed circuit board K the lead wires W of the component C to be placed on the circuit board K under the guidance of the insertion guide 41a in a known manner.

A rod 42 extends downwardly from the lever 28 through a hole in the body 58 and engages a roller 44 provided on the component cassette 25 against the insertion head 26 when a component on tape T is fed through constant pitch by the component cassette 25. During the descending movement of the lever 28, the component feed pin 43 provided at the lower end of the rod 42 hits the roller 44 of the component cassette 25 so that the component within the component cassette 25 is fed through a constant pitch interval to the insertion guide 41a on the insertion head 26 each time the roller 44 is struck.

Extra movement during the descending movement of the rod 42 is absorbed by a compression spring 45 provided between the rod and the pin 43.

An anvil unit 47, which secures the lead wires to the bottom of the circuit board K by a clinch pawl 48 disposed therein after the insertion of the lead wires W has been performed, is mounted on the lower anvil body 46. The circular arc motion of the upper portion of the clinch pawl 48 bends and secures the component lead wires coming through the printed circuit board K to the bottom thereof. The clinch pawl 48 is operated by a pneumatic cylinder supplied with air through an air port 49 from a conventional air source. The anvil unit 47 rises from the bottom position H to the raised position I where the printed circuit board K is engaged thereby to perform the bending and securing operations.

A tie rod 50 is connected between the lever 28 and the lower anvil body 46 through a lower level 51, which is connected with the anvil lever 51a by a shaft 52, to obtain the raising and lowering motions of the anvil unit 47 from the rotating motion of the lever 28. The vertical motion of the lower anvil body 46 is provided through the oscillating motion of the two levers 51 and 51a through a compression spring 54 provided inside a block 53, and a stop bolt 55 is provided to limit the upper position I of the anvil unit 47.

It is to be noted here that the bearing 56, which is adapted to support the cylindrical shaft 31 rotatably, is provided with the grooves 57 for rotating the cylindrical shaft 31 together with the inserter shaft 29 and is detachably mounted by the bolts 76 on the body 58 so that different grooves 57 in the bearings 56 can be moved into position to guide the ball 31b in the cylindrical shaft 31.

The steel ball 59 which rolls along a groove 57 in the bearing 56 is disposed in the recess 31a in the cylindrical shaft 31, and movement thereof in the radial direction of the cylindrical shaft 31 is limited by the collar 60 supported by the body 58.

A spherical bearing 61 is provided between the inserter shaft 29 and the lever 28 to allow the inserter shaft 29 to be rotated together with the cylindrical shaft 31 in the pair of bushings and a slide block 62, with the spherical bearing 61 therein is slidable in the longitudinal direction of the lever 28. The spherical bearing 61 is secured in the slide block by an upper nut 63 and a lower nut 64.

In FIG. 8, there is shown the appearance of the bearing 56 provided with a plurality of grooves 57 and 65, the steel ball 59, the cylindrical shaft 31 provided with the recess 31a, the collar 60, the body 58 provided with a plurality of holes 58a for bolts 76, and the bolts 76. The steel ball 59 disposed in the recess 31a drilled in the cylindrical shaft 31 rotates during the vertical motion of the cylindrical shaft 31 along a particular groove 57 in the bearing 56 selected according to the distance it is desired to move the steel ball 59 in the peripheral direction so as to rotate the cylindrical shaft 31. Since the steel ball 59 can turn on its axis and is in spot contact with the groove 57 in the bearing 56, so that the steel ball 59 can rotate smoothly, and the assembling and replacing of the cylindrical shaft 31 can be easily carried out.

Figure 13:
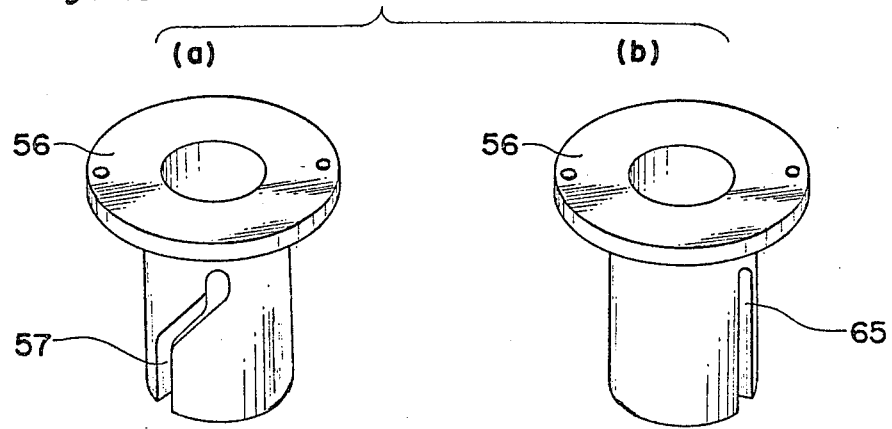
FIGS. 13(a) and 13(b) are perspective views showing a modified from of the bearing unit of FIG. 8.

Several grooves such as a twisted groove 57a, rectilinear groove 65, and the like are cut in the bearing 56 so that the angle through which the insertion head is rotated can be changed easily by changing the mounting position of the bearing 56. Also, even when a groove other than the above-described grooves 57 is necessary, the rotary angle can be changed by the replacement of the bearing 56 having groove 57 by a bearing 56a having groove 65 of different shape, as shown in FIGS. 13(a) and (b).

Referring to FIG. 9, there is shown a radial lead type component C comprising a component body $C_B$ and a pair of lead wires W extending in parallel from one edge of the component body $C_B$ in the radial direction of the component C2. These can be mounted in a known manner on a tape T so as to form the tape T as shown in FIG. 9(a). The radial lead component inserting apparatus 6 shown in FIGS. 10 to 12 is similar to and operates in almost the same manner as the axial lead type component inserting apparatus 6 of FIGS. 7 and 8 to guide the tape from the pack 17 to the component cassette 25 by means of the tape guide 16, to separate the individual components from the tape by cutting the pair of lead wires W as shown with FIG. 9(b), to form the lead wires W into a special shape by bending as shown in FIG. 9(c), to rotate the component C2 to the required position relative to the circuit board K by the ball in a cam groove 57 provided in a bearing unit 56 having the same construction as described above in connection with FIGS. 7 and 8, to insert the lead wires W into the corresponding holes k provided in the circuit board K as shown in FIG. 9(d), and, then, to bend the ends of the lead wires W so as to attach the component to the circuit board K as shown in FIG. 9(e). Therefore, the inserting apparatus 6 of FIGS. 10 to 12 is constructed of almost the same elements to that of FIGS. 7 and 8, and includes a means for guiding the component from the component cassette 66 to the circuit board K, a means for rotating the component to place it at the required position relative to the circuit board K, and a means for forming the lead wires W to insert them into and attach them to the circuit board K. In the apparatus 6 for inserting a radial lead type component C as shown in FIGS. 10 to 12, a component cassette 66 intermittently supplies radial lead type components on a tape at constant pitch intervals and the components flow along a path shown with the one-dot chain line of FIG. 12.

A guide 67 for scrap tape is provided to discharge the scrap tape after the components C have been removed therefrom at a component receiving position J, and a feed cylinder 68 is provided for the constant pitch feeding operation of the component cassette 66. When the components C are fed to the component removal position J by the component cassette 66, the insertion head 69 is operated to close chuck pawls 70 thereby to grasp the body of taping component C in a known manner.

A cutter 71 is actuated while the body of the component is retained by the insertion head 69 at the component withdrawing position J by simultaneously closing the upper member 72 and the lower member 73 to cut the component from the tape by a lead-wire cutting upper blade 74 and a lead-wire cutting lower blade 75, which are attached, respectively, to the members. Since the lead-wire cutting upper-blade 74 is valley-shaped and the lead-wire cutting lower blade 75 is angle-shaped, two lead wires are formed by the cutting-off operation and the lead wires are spread. After the upper member 72 and lower member 73 of the cutter 71 cut off the component, the levers open to return to their initial positions.

An inserter shaft 29 is moved downwardly by operation of the lever 28 driven by the insertion cylinder 27. At this time, since the inserter shaft 29 is connected with the cylindrical shaft 31 by the steel ball 30, they descend simultaneously until the stop ring 32 hits the buffer rubber ring 33 and the steel ball 30 escapes into the groove 34a in the lower bushing 34.

An insertion guide 79 is mounted on the lower end of the rack housing provided at the lower end of the cylindrical shaft 31. The tip end of the insertion guide 79 descends until it comes into contact with the top face of the printed circuit board K. The adjustment of the descent of the insertion guide 79 is performed by the stop ring 32 attached to the cylindrical shaft 31.

The insertion head 69 is rotated by the driving of the pinion 37 along the rack 38 during further descent of shaft 29, as in the axial lead type component apparatus, through 90° in the vertical direction from the component receiving position J to the rotated position I during descent of the cylindrical shaft 31. The tip end of the insertion guide 79 descends to the insertion position H where the tip end comes into contact with the top face of the printed circuit board K.

Thereafter, since only the inserter shaft 29 can descend, having been freed from the now securely held cylindrical shaft 31, and with an insertion head 69 with a component grasped therein is at the lower portion of the inserter shaft 29 facing directly downwardly, the lead wires W of the component C are inserted into the insertion holes k in the printed circuit board K being guided along grooves provided inside the insertion guide 79. After the insertion of the lead wires W, the chuck pawls 70 open. The inserter shaft 29 and the cylindrical shaft 31 then return to their initial positions.

An insertion head for the radial lead type component, the mechanism for the rotation of the cylindrical shaft 31 is the same as the insertion head of the axial lead type component shown in FIG. 7. Also, the operation of the anvil lower body 46 is the same.

The anvil unit 47 is mounted on the anvil lower body 46, and the clinching pawls 48 are opened or closed by the operation of the cylinder to cut off the lead wires W extending past the bottom of the printed circuit board K after the insertion, to a given length and simultaneously securing them. A suction pipe 82 sucks up the scraps of the cut-off lead wires W and a tube 83 is inserted into the pipe. Bolts 84 are provided for fixing the anvil unit 48, but can be loosened to allow the anvil unit 48 to rotate in an optional direction. A bracket 85, for mounting the component cassette 66 and the cutter 71, is secured to body 58 with two bolts 86.

In addition, a body frame 87 may be designed so that it can be used with both types of inserting apparatuses with the insertion head for the axial lead type component as shown in FIG. 7 or the radial lead type component as shown in FIG. 10.

As described hereinabove, an electronic component insertion head, which is adapted to be rotated by the insertion short having the steel ball guided in rotary bearing, is used to provide the desired rotation angle for the component to be inserted into the circuit board. Since only the cylindrical shaft together with the inserter shaft rotates and the supply position at which the component is supplied to the insertion head is stationary, the space needed for the inserting apparatus during the operation can be kept small so that, even when insertion heads are arranged side by side, they can be closely positioned.

Accordingly, the present apparatus is extremely useful as an electronic component insertion apparatus for inserting one component into a small-sized circuit board at any desired rotation angle.

Also, the groove may be provided in the cylindrical shaft and the ball in a recess in the bearing, but this is not practical. The provision of the groove directly in the shaft requires a different cam groove in the shaft when the rotary angle is required to be changed, which would require substitution of a shaft, thus necessitating a plurality of insertion shafts having grooves of different shape. This is very impractical.

On the other hand, according to the present invention, the bearing is changed or the position of the bearing is shifted to change the insertion angle of the component relative to the circuit board, thus providing an advantageous effect for the arrangement of the components on the circuit board.

In the present invention, a plurality of grooves are provided in the bearing to be selectively engaged by the ball, thereby to change the insertion angle of the insertion head. The present invention may be constructed to achieve this object by the selective use of a plurality of bearings having grooves of different shapes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component inserting apparatus comprising:
   means for placing a circuit board into a predetermined position;
   an insertion head for carrying a component to be placed on the circuit board;
   an engaging shaft on which said insertion head is carried and having a ball receiving recess therein;
   a machine body having a stationary bushing means therein in which said engaging shaft is slidably mounted for movement in the direction of the axis of said engaging shaft toward and away from a circuit board in said predetermined position, and in which said engaging shaft is rotatably mounted for movement around the axis of said engaging shaft;
   a moving means connected to said engaging shaft for moving said engaging shaft reciprocally in the direction of the axis thereof toward and away from a circuit board;
   a ball rotatably seated in said recess in said engaging shaft for rolling movement in said recess;
   a plurality of cam groove means mounted between said engaging shaft and said bushing means and only one of which is engaged by said ball at any given time said cam groove means having a shape for producing rotational movement of said engaging shaft around the axis thereof during axial movement of said engaging shaft toward and away from a circuit board, each of said cam groove means having a shape for guiding said engaging shaft through an angle of rotation different from the angles of rotation of the other cam groove means, said cam groove means being interchangeable for changing the rotation angle of said engaging shaft.

2. An electronic component inserting apparatus as claimed in claim 1 in which said cam groove means comprises a single bearing having a plurality of cam grooves therein spaced around the periphery of said bearing, said bearing being adjustably mounted on said machine body for adjustment in the rotational direction of said engaging shaft for changing the position of said cam grooves for bringing one of said cam grooves into position for engagement with said ball for giving to said engaging shaft the desired angle of rotation.

3. An electronic component inserting apparatus as claimed in claim 1 in which said cam groove means comprises a plurality of bearings each having a cam groove therein, said bearings being interchangeably mounted on said machine body for changing the cam groove with which the ball is engaged for giving to said engaging shaft the desired angle of rotation.

4. An electronic component inserting apparatus comprising:
   a circuit board conveyor means for conveying circuit boards in a predetermined path and periodically stopping circuit boards at a predetermined position along said path;
   an insertion head for carrying a component to be placed on the circuit board;
   an engaging shaft on which said insertion head is carried and having a ball receiving recess therein;
   a machine body positioned along said path and having stationary bushing means therein in which said engaging shaft is slidably mounted for movement in the direction of the axis of said engaging shaft toward and away from a circuit board in said predetermined position, and in which said engaging shaft is rotatably mounted for movement around the axis of said engaging shaft;
   a moving means connected to said engaging shaft for moving said engaging shaft reciprocally in the direction of the axis thereof toward and away from a circuit board;
   a ball rotatably seated in said recess in said engaging shaft for rolling movement in said recess;
   a plurality of cam groove means mounted between said engaging shaft and said bushing means and only one of which is engaged by said ball at any given time said cam groove means having a shape for producing rotational movement of said engaging shaft around the axis thereof during axial movement of said engaging shaft toward and away from a circuit board, each of said cam groove means having a shape for guiding said engaging shaft through an angle of rotation different from the angles of rotation of the other cam groove means, said cam groove means being interchangeable for changing the rotation angle of said engaging shaft.

* * * * *